United States Patent
Kleinhans et al.

(10) Patent No.: US 8,378,268 B2
(45) Date of Patent: Feb. 19, 2013

(54) OPERATOR CONTROL UNIT

(75) Inventors: Andreas Kleinhans, Eppingen (DE);
Randolf Kraus, Bretten (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 209 days.

(21) Appl. No.: 12/843,334

(22) Filed: Jul. 26, 2010

(65) Prior Publication Data

US 2011/0017723 A1   Jan. 27, 2011

(30) Foreign Application Priority Data

Jul. 27, 2009 (DE) .................... 10 2009 035 758

(51) Int. Cl.
*H03B 3/68* (2006.01)
(52) U.S. Cl. .................... 219/443.1; 219/452.11
(58) Field of Classification Search ............... 219/443.1, 219/444.1, 445.1, 446.1, 447.1, 448.11, 448.12, 219/452.11
See application file for complete search history.

(56) References Cited

U.S. PATENT DOCUMENTS

| | | | | |
|---|---|---|---|---|
| 2,637,800 | A * | 5/1953 | Hammell | 219/447.1 |
| 6,002,112 | A * | 12/1999 | Nass et al. | 219/443.1 |
| 6,050,176 | A * | 4/2000 | Schultheis et al. | 219/445.1 |
| 6,399,924 | B1 * | 6/2002 | Cai | 219/443.1 |
| 6,797,297 | B2 * | 9/2004 | Schneider | 219/445.1 |
| 6,940,049 | B2 * | 9/2005 | Harwell et al. | 219/448.12 |
| 6,967,314 | B2 * | 11/2005 | Sauter et al. | 219/448.12 |
| 7,009,150 | B2 * | 3/2006 | Wennemann et al. | 219/452.11 |
| 7,022,949 | B2 * | 4/2006 | Shukla | 219/452.11 |
| 7,763,832 | B2 * | 7/2010 | Striegler et al. | 219/448.11 |

FOREIGN PATENT DOCUMENTS

| | | |
|---|---|---|
| DE | 20 2004 017 133 U1 | 2/2005 |
| DE | 20 2005 008 787 U1 | 8/2005 |
| DE | 10 2004 038 826 A1 | 3/2006 |
| DE | 10 2005 018298 | 10/2006 |
| EP | 1 876 515 | 1/2008 |
| WO | WO 2006/015711 | 2/2006 |

OTHER PUBLICATIONS

German Office Action for German Application No. 10 2009 035 758.0 dated Feb. 18, 2010.
Search Report dated Jan. 5, 2012 for European Application No. 10169249.9.

* cited by examiner

*Primary Examiner* — Trong Phan
(74) *Attorney, Agent, or Firm* — Alston & Bird LLP

(57) ABSTRACT

An operator control unit for operator control of a cooktop comprising at least two cooking zones, with at least one of the cooking zones having two heating rings that can be separately activated. The operator control unit comprises at least one selection element to select a cooking zone, at least one adjusting element, it being possible to adjust a heating power of a selected cooking zone by operating said adjusting element, and a control unit coupled to the at least one selection element and the at least one adjusting element, and which detects operation of the at least one selection element and the at least one adjusting element. The control unit can control at least one of the at least two heating rings of the selected cooking zone in the event of an operating duration in a second time period which differs from the first time period range.

5 Claims, 3 Drawing Sheets

OPERATOR CONTROL UNIT

RELATED APPLICATIONS

This application claims priority to German Application Number 10 2009 035 758, filed on Jul. 27, 2009, the contents of which are incorporated by reference for all that it teaches.

FIELD OF THE INVENTION

The invention relates to an operator control unit for operator control of a cooktop.

BACKGROUND OF THE INVENTION

Cooktops usually comprise a plurality of cooking zones which are separated from one another. A respective cooking zone can comprise one or more heating rings that can be activated separate from one another. For example, an inner heating ring can be only activated for a cooking vessel with a small diameter, while an outer heating ring can be activated in addition to the inner heating ring for a cooking vessel with a larger diameter.

Operator control units where the heating power of a cooking zone can be adjusted, amongst other things, are provided for operator control of cooktops. In order to keep the number of operator control and adjusting elements required as low as possible, it may be expedient to assign adjusting elements to a plurality of cooking zones. To this end, one operator control unit in the form of a selection element can, for example, be provided for each cooking zone, it being possible for a cooking zone to be selected by means of said selection element. In this case, only one single operator control element in the form of an adjusting element is provided for adjusting the heating power, said adjusting element comprising, for example, a plus key and a minus key, it being possible to adjust the heating power of the selected cooking zone by operating said adjusting element. If the corresponding cooking zone has a plurality of heating rings, at least one additional operator control element with which, for example, a second heating ring is activated and deactivated, can usually be provided.

SUMMARY OF INVENTION

The invention is based on the technical problem of providing an operator control unit for operator control of a cooktop, said operator control unit permitting convenient and reliable operator control with a comparatively low number of operator control elements.

One embodiment of the invention solves this problem by way of an operator control unit as claimed herein.

Preferred embodiments are the subject matter of the dependent claims, the wording of said dependent claims hereby being included in the content of the description by reference.

The operator control unit according to one embodiment of the invention serves for operator control of a cooktop which has at least two cooking zones which are separated from one another. At least one of the cooking zones comprises two heating rings which can be activated separately from one another and in each case comprise radiant heating bodies and/or induction heating coils. The operator control unit comprises at least one selection element which serves to select a cooking zone. At least one adjusting element is additionally provided, said adjusting element serving to adjust the heating power of a previously selected cooking zone. A control unit, for example in the form of a conventional microprocessor, is coupled to the selection element or elements and to the adjusting element or elements and detects operation of said elements. The control unit is designed to record an operating duration of the selection element. To this end, the control unit determines how long an operator or user operates the selection element, for example how long said operator or user leaves his finger on the selection element in the form of a capacitive key. If the operating duration is in the range of a first time period, the operation results in a cooking zone being selected. However, if the operating duration is in the range of a second time period which differs from the first time period range, at least one of the heating rings of the selected cooking zone is activated or deactivated. If the selected cooking zone has, for example, two heating rings, the second heating ring can be activated or deactivated by an operating duration in the second time period, that is to say that, in addition to selecting a cooking zone, it is also possible to toggle the second heating ring by means of the selection element. If the selected cooking zone comprises more than two heating rings, it is possible to switch on successive further heating rings, for example, by means of operating the selection element. When all the heating rings of the selected cooking zone are finally activated, the heating rings can be successively deactivated in a corresponding manner. Brief operation of the selection element can result, for example, in selection and longer operation can result in a heating ring being switched on or switched off. The heating power of the heating ring which is already activated is preferably assumed for the additionally activated heating ring. The operator control unit according to one embodiment of the invention does not require an additional operator control element for activating or deactivating the heating ring or further heating rings, as a result of which operator control elements can be saved. This allows more cost-effective production of the operator control unit while retaining the same operability.

In another embodiment of the invention, the time periods of the first time period range are shorter than the time periods of the second time period range, that is to say, brief operation results in selection and long operation results in activation or deactivation of the heating rings.

In another embodiment of the invention, precisely one selection element is provided for each cooking zone.

In another embodiment of the invention, a single adjusting element is provided for all the cooking zones. The adjusting element may comprise, for example, a plus key for increasing the heating power and a minus key for reducing the heating power.

In another embodiment of the invention, the at least one selection element and/or the at least one adjusting element are/is designed as a capacitive sensor element or capacitive key.

BRIEF DESCRIPTION OF THE DRAWINGS

Preferred embodiments of the invention are schematically illustrated in the drawings, in which.

DETAILED DESCRIPTION

Figure 1:
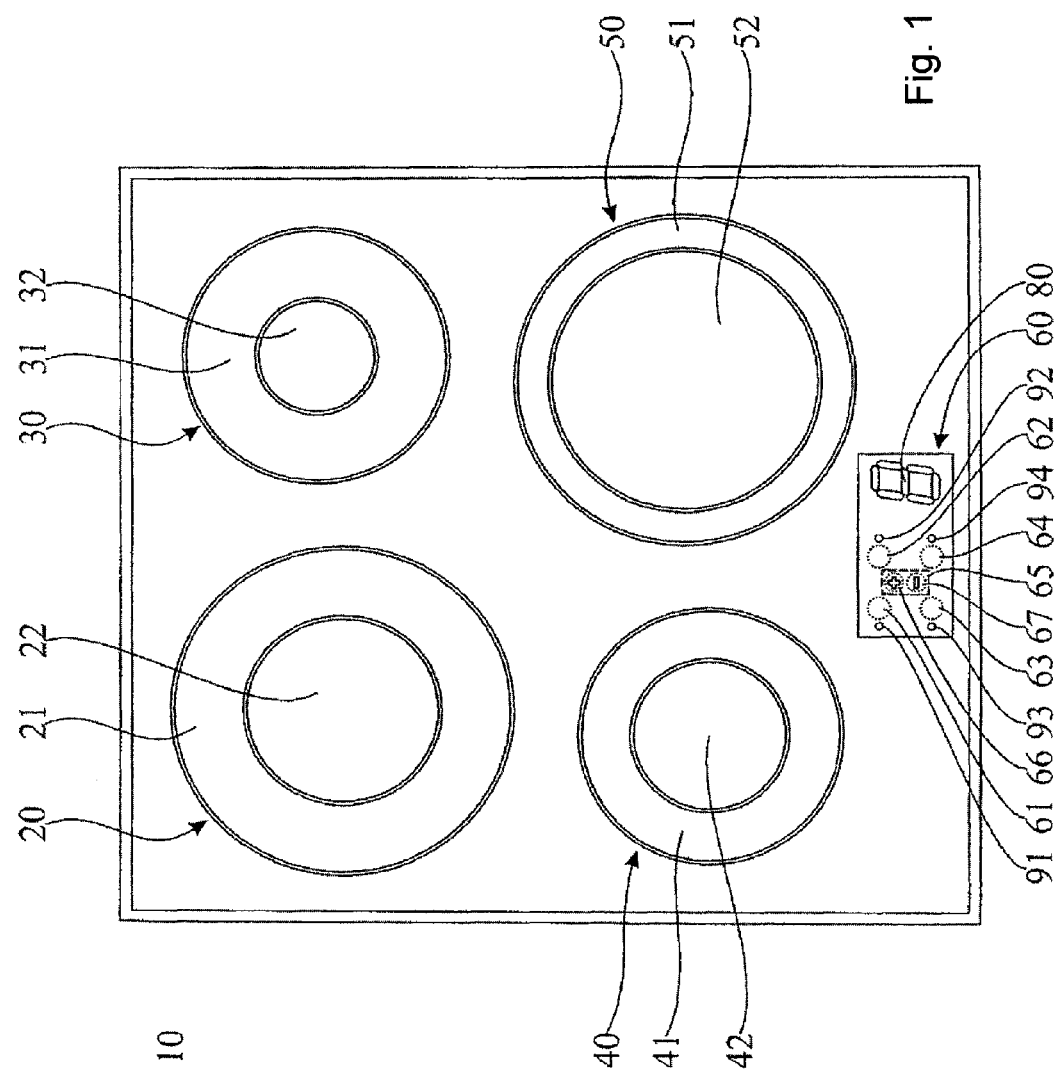
FIG. 1 shows a cooktop having an operator control unit according to one embodiment of the invention.

FIG. 1 shows a cooktop 10 which has four cooking zones 20, 30, 40 and 50 which are separated from one another. The cooking zones 20, 30, 40 and 50 each have two heating rings 21 and 22, 31 and 32, 41 and 42 and 51 and 52 which can be activated separately from one another and in each case comprise, for example, radiant heating bodies. The inventive principles can apply to a cooktop having greater or fewer cooking zones than are illustrated. It is clear that the invention does not require all the cooking zones to have a plurality of heating rings. In addition, more than two heating rings may be provided for each cooking zone.

An operator control unit 60 is provided for the purpose of operator control of the cooktop 10, said operator control unit having an operator control element in the form of a selection element 61, 62, 63 and 64, in each case in the form of a capacitive sensor element or capacitive button, for each cooking zone. An operator control element in the form of an adjusting element 65 comprising a plus key 66 and a minus key 67, in each case in the form of a capacitive sensor element or capacitive button, serves to adjust the heating power of a selected cooking zone.

A light-emitting diode 91, 92, 93 and 94 is assigned to each selection element 61, 62, 63 and 64, with an activated light-emitting diode 91, 92, 93 and 94 indicating that the cooking zone which is (geometrically) correspondingly arranged on the cooktop 10 is selected. A heating power display 80 indicates the set heating power of the selected cooking zone.

Figure 2:
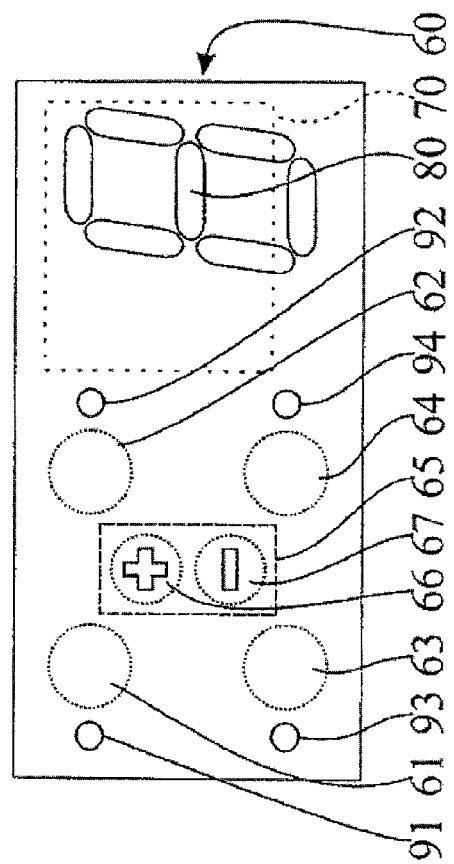
FIG. 2 shows a block diagram of the operator control unit according to the embodiment shown in FIG. 1.

FIG. 2 shows a block diagram of the operator control unit 60 from FIG. 1. The selection elements 61, 62, 63 and 64, the light-emitting diodes 91, 92, 93 and 94, the heating power display 80 and the adjusting element 65 or 66 and 67 are coupled to a control unit (schematically illustrated) in the form of a microcontroller 70 (shown as underneath), said microcontroller detecting operation of the elements 61, 62, 63, 64, 66 and 67 and recording an operating duration of the selection elements 61, 62, 63 and 64.

Figure 3A:
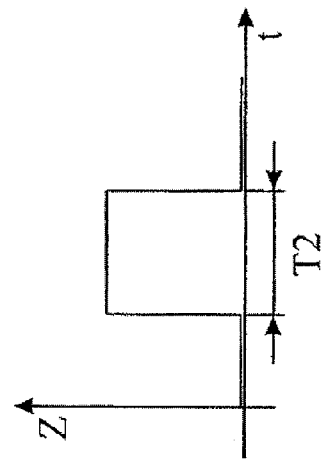
FIGS. 3a and 3b show timing diagrams of different operator control scenarios.
Figure 3B:
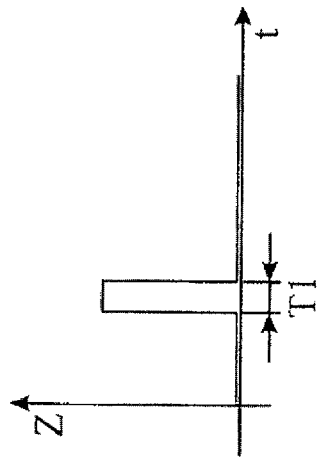

FIGS. 3a and 3b show different operating scenarios of one of the selection elements 61, 62, 63 and 64. In the event of brief operation of the selection element (Z) (see partial diagram (a)) the control unit 70 determines an operating duration T1 of the selection element in a first time period, for example, in a time (t) period range of 10 ms to 1000 ms. From this, the control unit 70 can deduce that a user wishes to select a cooking zone. The control unit 70 consequently activates that cooking zone to which the selection element is assigned and also activates the corresponding light-emitting diode. The operator now has the option of adjusting the heating power of the cooking zone in question by means of the adjusting element 65 by reducing the heating power by operating the minus key 67 or increasing the heating power by operating the plus key 66. The associated heating power is displayed on the heating power display 80.

If the user operates the selection element (Z) for a longer length of time, the control unit 70 determines an operating duration T2 (see FIG. 3b) in a second time period, for example, in a time (t) period of 1500 ms to 3000 ms. The control unit 70 then activates or deactivates the outer heating ring of the cooking zone in question. If, for example, the cooking zone 20 is currently activated, the control unit 70 checks whether the outer heating ring 21 is activated or not. If the outer heating ring 21 is not activated, said ring is activated, and if the outer heating ring 21 is activated, said ring is deactivated. The result of the selection element 62 being pressed for a long length of time is what is known as toggling of the outer heating ring 21.

After switching on the operator control unit or after resetting of the operator control unit, a predetermined one of the cooking zones may be preselected without having selected this cooking zone by means of the corresponding selection element before. This makes sure that one of the cooking zones is always selected. Alternatively, a toggling of an outer heating ring may be omitted or the corresponding cooking zone may be selected, if a selection element is pressed for a long length of time without having selected a cooking zone before by pressing one of the selection elements a short length of time.

In the embodiment shown, precisely one selection element is provided for each cooking zone. As an alternative, only one single, common selection element can also be provided for all the cooking zones. In the event of brief operation of the selection element, the respectively next cooking zone, for example starting from cooking zone 20, to cooking zone 30 and up to cooking zone 50 and then back to cooking zone 20 etc., is selected in this case. The result of the selection element being pressed for a relatively long length of time is activation or deactivation of the outer heating ring of the currently selected cooking zone.

The embodiments shown permit convenient and reliable operator control with a comparatively low number of operator control elements.

The invention claimed is:

1. An operator control unit for operator control of a cooktop, said cooktop comprising at least two cooking zones separated from one another, with at least one of the cooking zones having two heating rings that can be activated separately from one another, with the operator control unit comprising:
   at least one selection element configured to select a cooking zone by operating said selection element;
   at least one adjusting element configured to adjust a heating power of said selected cooking zone by operating said adjusting element; and
   a control unit coupled to the at least one selection element and the at least one adjusting element configured to detect operation of the at least one selection element and the at least one adjusting element,
   wherein the control unit is further configured to:
      record an operating duration of the selection element,
      select a cooking zone in response to said operating duration being within in a first time period range, and
      activate or deactivate at least one of the at least two heating rings of the selected cooking zone in response to said operating being within a second time period range which differs from the first time period range.

2. The operator control unit as claimed in claim 1, wherein the first time period is shorter than the second time period range.

3. The operator control unit as claimed in claim 1, wherein only one selection element is provided for each cooking zone.

4. The operator control unit as claimed in claim 1, wherein a single adjusting element is provided for all the cooking zones.

5. The operator control unit as claimed in claim 1, wherein the at least one selection element and the at least one adjusting element are capacitive sensors.

* * * * *